United States Patent
Chiu et al.

(10) Patent No.: US 10,068,986 B1
(45) Date of Patent: Sep. 4, 2018

(54) ENHANCED-MODE HIGH ELECTRON MOBILITY TRANSISTOR AND METHOD FOR FORMING THE SAME

(71) Applicant: Vanguard International Semiconductor Corporation, Hsinchu (TW)

(72) Inventors: Chien-Wei Chiu, Beigang Township (TW); Shin-Cheng Lin, Tainan (TW); Yung-Hao Lin, Jhunan Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/795,627

(22) Filed: Oct. 27, 2017

(51) Int. Cl.
*H01L 29/66* (2006.01)
*H01L 29/423* (2006.01)
(Continued)

(52) U.S. Cl.
CPC .... *H01L 29/66462* (2013.01); *H01L 29/0642* (2013.01); *H01L 29/2003* (2013.01);
(Continued)

(58) Field of Classification Search
CPC ............ H01L 29/0642; H01L 29/2003; H01L 29/4236; H01L 29/66462; H01L 29/7788; H01L 29/7827; H01L 2924/13064
See application file for complete search history.

(56) References Cited

U.S. PATENT DOCUMENTS 8,653,559 B2 * 2/2014 Corrion ............... H01L 29/4236
257/192
9,755,061 B2 * 9/2017 Ozaki ................. H01L 29/7786
(Continued)

FOREIGN PATENT DOCUMENTS

JP     2010232610 A  * 10/2010    ........... H01L 29/513
TW     201631767 A     9/2016
(Continued)

OTHER PUBLICATIONS

Cai et al., Control of Threshold Voltage of AlGaN/GaN HEMTs by Fluoride-Based Plasma Treatment From Depletion Mode to Enhancement Mode, IEEE Transactions on Electron Devices, vol. 53, No. 9, 2006, pp. 2007-2215.*
(Continued)

*Primary Examiner* — Earl Taylor
(74) *Attorney, Agent, or Firm* — Birch, Stewart, Kolasch & Birch, LLP

(57) ABSTRACT

Embodiments of the disclosure relate to an enhanced-mode high electron mobility transistor. The enhanced-mode high electron mobility transistor includes a substrate, a first III-V semiconductor layer disposed on the substrate, a second III-V semiconductor layer disposed on the first III-V semiconductor layer, a third III-V semiconductor layer disposed on the second III-V semiconductor layer, an amorphous region extending from the third III-V semiconductor layer into the second III-V semiconductor layer and the first III-V semiconductor layer to serve as an isolation region, and a gate electrode disposed in the amorphous region. The second III-V semiconductor layer and the third III-V semiconductor layer include different materials to form a heterojunction.

15 Claims, 5 Drawing Sheets

(51) Int. Cl.
*H01L 29/778* (2006.01)
*H01L 29/78* (2006.01)
*H01L 29/20* (2006.01)
*H01L 29/06* (2006.01)

(52) U.S. Cl.
CPC ...... *H01L 29/4236* (2013.01); *H01L 29/7788* (2013.01); *H01L 29/7827* (2013.01)

(56) References Cited

U.S. PATENT DOCUMENTS

| | | | | |
|---|---|---|---|---|
| 2006/0273347 | A1* | 12/2006 | Hikita | H01L 29/66462 257/192 |
| 2011/0241017 | A1* | 10/2011 | Ikeda | H01L 29/0847 257/76 |
| 2013/0001646 | A1* | 1/2013 | Corrion | H01L 29/4236 257/194 |
| 2014/0264451 | A1* | 9/2014 | Ozaki | H01L 29/513 257/194 |
| 2015/0084104 | A1* | 3/2015 | Ando | H01L 29/4236 257/288 |
| 2016/0233328 | A1* | 8/2016 | Cheng | H01L 29/511 |
| 2017/0352752 | A1* | 12/2017 | Ozaki | H02M 3/33569 |

FOREIGN PATENT DOCUMENTS

| | | |
|---|---|---|
| TW | 201639167 A | 11/2016 |
| WO | WO 2011/007483 A1 | 1/2011 |

OTHER PUBLICATIONS

Jiang et al., Improvement of device isolation using field implantation for GaN MOSFETs, Semiconductor Science and Technology, 31, 2016, pp. 1-9.*

Shiu et al., Oxygen Ion Implantation Isolation Planar Process for AlGaN/GaN HEMTs, IEEE Electron Device Letters, vol. 28, No. 6, 2007, pp. 476-478.*

Jiang et al., Effect of Oxygen Ion Implantation in Gallium Nitride, Materials Research Society Proceedings, vol. 537, 1999, 6 pages.*

* cited by examiner

US 10,068,986 B1

ENHANCED-MODE HIGH ELECTRON MOBILITY TRANSISTOR AND METHOD FOR FORMING THE SAME

BACKGROUND

Embodiments of the present disclosure relate to a semiconductor device, and in particular they relate to an enhanced-mode high electron mobility transistor (HEMT).

Semiconductor devices are used in a variety of electronic applications, such as high power devices, personal computers, cell phones, digital cameras, and other electronic devices. These semiconductor devices are typically fabricated by depositing an insulating layer or dielectric layer, a conductive layer material, and a semiconductor layer material on the semiconductor substrate, followed by patterning the various material layers by using a photolithography process. Therefore, the circuit devices and components are formed on the semiconductor substrate.

Among these devices, high electron mobility transistors (e.g., enhanced-mode high electron mobility transistors) have been widely used in the field of high-power applications since they have such advantages as high output power and high breakdown voltage.

However, existing enhanced-mode high electron mobility transistors are not satisfactory in every respect.

SUMMARY

Some embodiments of the present disclosure relate to an enhanced-mode high electron mobility transistor. The enhanced-mode high electron mobility transistor includes a substrate, a first III-V semiconductor layer disposed on the substrate, a second III-V semiconductor layer disposed on the first III-V semiconductor layer, and a third III-V semiconductor layer disposed on the second III-V semiconductor layer. The second III-V semiconductor layer and the third III-V semiconductor layer include different materials to form a heterojunction. The enhanced-mode high electron mobility transistor also includes an amorphous region extending from the third III-V semiconductor layer into the second III-V semiconductor layer and the first III-V semiconductor layer to serve as an isolation region, and a gate electrode disposed in the amorphous region.

Some embodiments of the present disclosure relate to a method for forming an enhanced-mode high electron mobility transistor. The method includes providing a substrate, forming a first III-V semiconductor layer on the substrate, forming a second III-V semiconductor layer on the first III-V semiconductor layer, and forming a third III-V semiconductor layer on the second III-V semiconductor layer. The second III-V semiconductor layer and the third III-V semiconductor layer include different materials to form a heterojunction. The method also includes forming an amorphous region extending from the third III-V semiconductor layer into the second III-V semiconductor layer and the first III-V semiconductor layer to serve as an isolation region, and forming a gate electrode in the amorphous region.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIGS. 1-7 are a series of cross-sectional views illustrating a method for forming an enhanced-mode high electron mobility transistor according to an embodiment of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Various embodiments of the present disclosure will be discussed below. Like reference numerals may be used to represent like components. It should be understood that additional steps can be implemented before, during, or after the illustrated methods, and some steps might be replaced or omitted in other embodiments of the illustrated methods.

In a method for forming an enhanced-mode high electron mobility transistor of an embodiment of the present disclosure, an ion implantation process is performed to transform a portion of the semiconductor layer into an amorphous region, and a gate electrode is formed in the amorphous region. Therefore, gate-leakage current can be avoided or reduced.

First Embodiment

FIG. 1 illustrates an initial step of the first embodiment of the present disclosure. First, a substrate 100 is provided. For example, the substrate 100 may be a silicon substrate, a silicon carbide (SiC) substrate, a sapphire substrate, a multi-layer substrate, a gradient substrate, another applicable substrate, or a combination thereof. In some embodiments, the substrate 100 may be a semiconductor-on-insulator (SOI) substrate (e.g., a silicon-on-insulator substrate or a germanium-on-insulator substrate). The semiconductor-on-insulator substrate may include a bottom substrate, a buried oxide layer disposed on the bottom substrate, and a semiconductor layer disposed on the buried oxide layer.

Figure 2:

Then, as shown in FIG. 2, a first III-V semiconductor layer 200 is formed on the substrate 100. In some embodiments, the first III-V semiconductor layer 200 may include an n-type III-V semiconductor material which may be doped with silicon, oxide, other applicable dopants, or a combination thereof. In some embodiments, the n-type III-V semiconductor material may include n-type binary III-V semiconductor material (e.g., n-type GaN). In some embodiments, the first III-V semiconductor layer 200 may be formed on the substrate 100 using molecular-beam epitaxy (MBE), metalorganic chemical vapor deposition (MOCVD), hydride vapor phase epitaxy (HVPE), other applicable methods, or a combination thereof.

In some embodiments, a buffer layer (not shown in the figure) may optionally be formed on the substrate 100 before the first III-V semiconductor layer 200 is formed. Then, the first III-V semiconductor layer 200 may be formed on the buffer layer. The buffer layer may avoid or reduce the defects resulting from the lattice mismatch between the substrate 100 and the first III-V semiconductor layer 200. For example, in the embodiment of which the first III-V semiconductor layer 200 is made of n-type GaN, the buffer layer may include AlN, AlGaN, other applicable materials, or a combination thereof.

Figure 3:
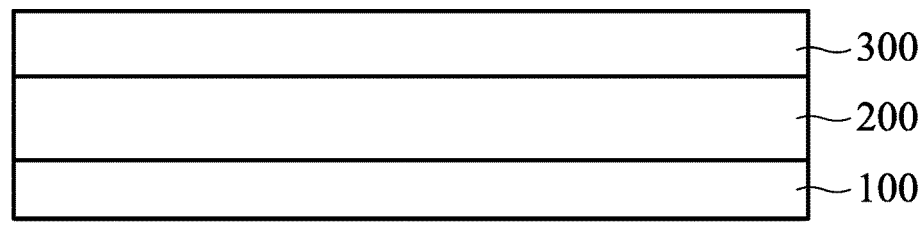

Then, as shown in FIG. 3, a second III-V semiconductor layer 300 is formed on the first III-V semiconductor layer 200. In some embodiments, the second III-V semiconductor layer 300 may include a p-type III-V semiconductor material which may be doped with magnesium, other applicable dopants, or a combination thereof. In some embodiments, the p-type III-V semiconductor material may include p-type binary III-V semiconductor material (e.g., p-type GaN). In some embodiments, the second III-V semiconductor layer 300 may be formed on the first III-V semiconductor layer 200 using molecular-beam epitaxy (MBE), metalorganic chemical vapor deposition (MOCVD), hydride vapor phase epitaxy (HYPE), other applicable methods, or a combination thereof.

Figure 4:
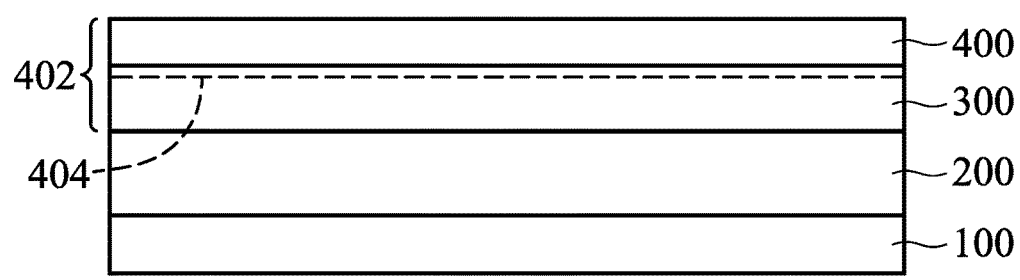

Then, as shown in FIG. 4, a third III-V semiconductor layer 400 is formed on the second III-V semiconductor layer 300. In some embodiments, the third III-V semiconductor layer 400 may include an undoped III-V semiconductor material. In some embodiments, the undoped III-V semiconductor material may include undoped ternary III-V semiconductor material (e.g., undoped AlGaN). In some embodiments, the third III-V semiconductor layer 400 may be formed on the second III-V semiconductor layer 300 using molecular-beam epitaxy (MBE), metalorganic chemical vapor deposition (MOCVD), hydride vapor phase epitaxy (HVPE), other applicable methods, or a combination thereof.

As shown in FIG. 4, the third III-V semiconductor layer 400 includes the material which is different from the material of the second III-V semiconductor layer 300, such that a heterojunction 402 is formed (e.g., a heterojunction formed of AlGaN layer 400 and GaN layer 300). In some embodiments, two-dimensional electron gas (2 DEG) 404 is generated by the heterojunction 402. The two-dimensional electron gas 404 may be generated in the second III-V semiconductor layer 300 and may extend along an interface of the second III-V semiconductor layer 300 and the third III-V semiconductor layer 400.

Figure 5:
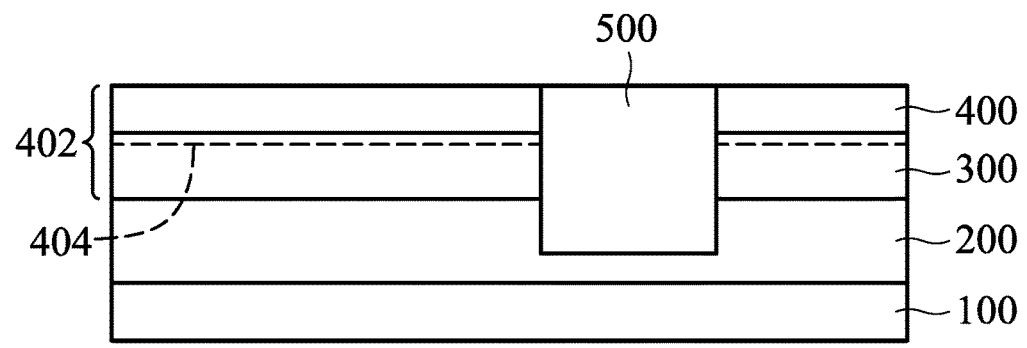

Then, as shown in FIG. 5, an amorphous region 500 is formed. The amorphous region 500 may extend from the third III-V semiconductor layer 400 into the second III-V semiconductor layer 300 and the first III-V semiconductor layer 200. For example, the amorphous region 500 may serve as an isolation region to avoid or reduce the gate-leakage current, and the detail will be discussed later. In addition, as shown in FIG. 5, in some embodiments, the amorphous region 500 extends into the first III-V semiconductor layer 200 but does not extend to (or reach) a bottom surface of the first III-V semiconductor layer 200.

For example, the amorphous region 500 may include an amorphized III-V semiconductor material. For example, in the present embodiment, the amorphous region 500 includes amorphized GaN and AlGaN. In some embodiments, an implantation process may be performed to implant heavy ions (e.g., oxygen ions, other applicable ions, or a combination thereof) into a portion of the first III-V semiconductor layer 200, a portion of the second III-V semiconductor layer 300, and a portion of the third III-V semiconductor layer 400, such that the portion of the first III-V semiconductor layer 200, the portion of the second III-V semiconductor layer 300, and the portion of the third III-V semiconductor layer 400 are transformed to be amorphous (i.e., crystalline-to-amorphous transformation) to serve as the amorphous region 500.

Figure 6:
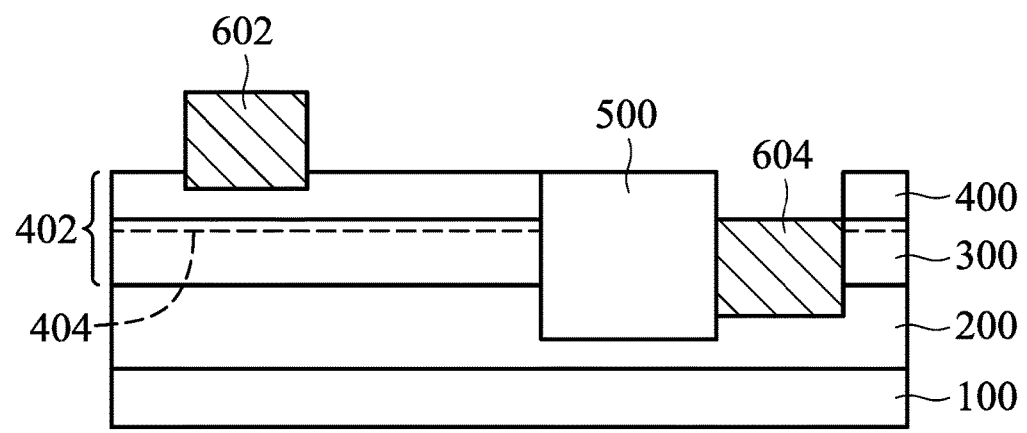

Then, as shown in FIG. 6, a source ohmic contact 602 and a drain ohmic contact 604 are formed. For example, the source ohmic contact 602 and the drain ohmic contact 604 may respectively include Ti, Al, Au, Pd, other applicable metals, an alloy thereof, or a combination thereof. In some embodiments, the source ohmic contact 602 is in direct contact with the third III-V semiconductor layer 400, and the drain ohmic contact 604 is in direct contact with the first III-V semiconductor layer 200. For example, trenches (not shown in the figures) corresponding to the source ohmic contact 602 and the drain ohmic contact 604 may be formed in the first III-V semiconductor layer 200, the second III-V semiconductor layer 300, and the third III-V semiconductor layer 400 by performing one or more etching processes. Then, a physical vapor deposition process (PVD, e.g., evaporation process or sputtering process), an electroplating process, an atomic layer deposition process (ALD), another applicable process, or a combination thereof may be performed to form an applicable conductive material which fills the trenches. Then, an applicable patterning process (e.g., a lithography process, an etching process, or a combination thereof) may be performed to remove an excessive portion of the conductive material, and a remaining portion of the conductive material may serve as the source ohmic contact 602 and the drain ohmic contact 604.

Figure 7:
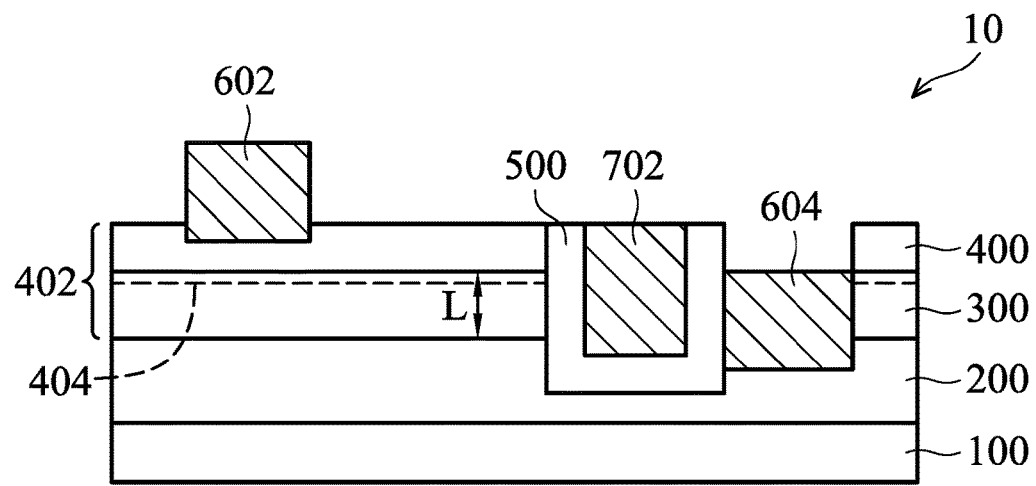

Then, as shown in FIG. 7, a gate electrode 702 is formed in the amorphous region 500 to form a high electron mobility transistor 10. For example, the gate electrode 702 may include a metal, poly-silicon, other applicable conductive materials, or a combination thereof. For example, a trench (not shown in the figures) corresponding to the gate electrode 702 may be formed in the amorphous region 500 by performing one or more etching processes. Then, a physical vapor deposition process (PVD, e.g., evaporation process or sputtering process), an electroplating process, an atomic layer deposition process (ALD), another applicable process, or a combination thereof may be performed to form an applicable conductive material which fills the trench. Then, an applicable patterning process (e.g., a lithography process, an etching process, or a combination thereof) may be performed to remove an excessive portion of the conductive material, and a remaining portion of the conductive material may serve as the gate electrode 702.

As shown in FIG. 7, in the present embodiment, the high electron mobility transistor 10 is an enhanced-mode high electron mobility transistor (i.e., normally-off). The p-type second III-V semiconductor layer 300 (e.g., p-type GaN) may serve as a channel region of the high electron mobility transistor 10. As shown in FIG. 7, the gate electrode 702 of the high electron mobility transistor 10 is formed in the amorphous region 500. Since the amorphous region 500 can serve as an isolation region, the gate-leakage current can be avoided or reduced.

Notably, in the embodiments of the present disclosure, a channel length L of the high electron mobility transistor 10 may be substantially equal to a thickness of the p-type second III-V semiconductor layer 300. Therefore, the channel length L of the high electron mobility transistor 10 can be accurately controlled by controlling the thickness of the epitaxially grown p-type second III-V semiconductor layer 300. In contrast, the channel length of a conventional high electron mobility transistor is affected by the etching process, and thus it cannot be accurately controlled in the way that the channel length L of the embodiments of the present disclosure can be accurately controlled by controlling the deposition parameters.

In summary, the gate electrode of the high electron mobility transistor of the embodiments of the present disclosure is formed in the amorphous region (e.g., amorphized III-V semiconductor material). Therefore, the gate-leakage current can be avoided or reduced, and the device performance can be improved.

Second Embodiment

Figure 8:
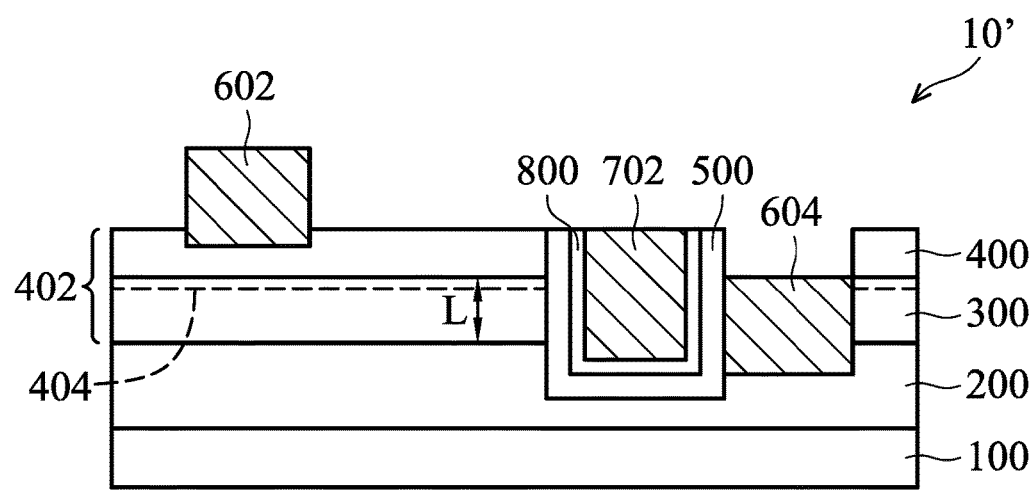
FIG. 8 is a cross-sectional view illustrating an enhanced-mode high electron mobility transistor according to some embodiments of the present disclosure.

FIG. 8 illustrates a high electron mobility transistor 10' of the second embodiment of the present disclosure. As shown in FIG. 8, a gate dielectric layer 800 is further disposed between the gate electrode 702 and the amorphous region 500 of the high electron mobility transistor 10' to further reduce the gate-leakage current. For example, the gate dielectric layer 800 may surround or partially surround the gate electrode 702. In some embodiments, the gate dielectric layer 800 may include silicon oxide, $HfO_2$, HfSiO, HfSiON, HfTaO, HfSiO, HfZrO, silicon nitride, silicon oxynitride, zirconium oxide, titanium oxide, aluminium oxide, $HfO_2$—$Al_2O_3$, other applicable dielectric materials, or a combination thereof. In some embodiments, the gate dielectric layer 800 may be formed by a chemical vapor deposition (CVD) process, an atomic layer deposition (ALD) process, other applicable processes, or a combination thereof. For example, the chemical vapor deposition process may include a high density plasma chemical vapor deposition (HDPCVD) process, a metal organic chemical vapor deposition (MOCVD) process, or a plasma enhanced chemical vapor deposition (PECVD) process. For example, the gate dielectric layer may be formed in the gate trench discussed above after the step of forming the gate trench and before the step of filling the gate trench with the conductive material.

Third Embodiment

Figure 9:
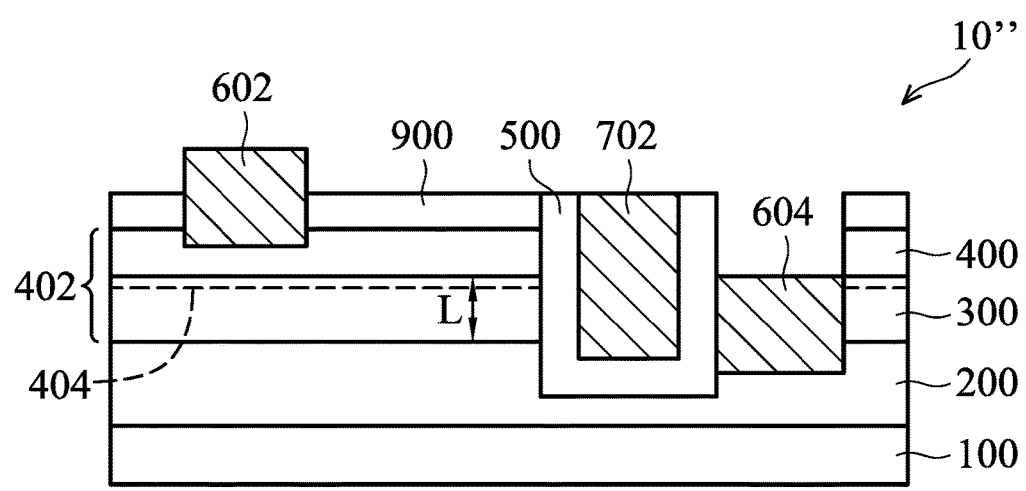
FIG. 9 is a cross-sectional view illustrating an enhanced-mode high electron mobility transistor according to some embodiments of the present disclosure.

FIG. 9 illustrates a high electron mobility transistor 10" of the third embodiment of the present disclosure. As shown in FIG. 9, a passivation layer 900 is further disposed on the third III-V semiconductor layer 400 to protect the layers under the passivation layer 900. For example, the passivation layer 900 may include SiN, AlN, other applicable materials, or a combination thereof. For example, the passivation layer 900 may be formed by a molecular-beam epitaxy (MBE) process, metalorganic chemical vapor deposition (MOCVD) process, a hydride vapor phase epitaxy (HVPE) process, other applicable processes, or a combination thereof. In some embodiments, the implantation process discussed above may also be used to implant heavy ions into a portion of the passivation layer 900, such that the portion of the passivation layer 900 becomes a portion of the amorphous region 500. It should be understood that a gate dielectric layer may also be disposed between the gate electrode 702 and the amorphous region 500 of the high electron mobility transistor 10".

In summary, the gate electrode of the high electron mobility transistor of the embodiments of the present disclosure is formed in the amorphous region (e.g., amorphized III-V semiconductor material). Therefore, the gate-leakage current can be avoided or reduced, and the device performance can be improved.

The foregoing outlines features of several embodiments so that those skilled in the art may better understand the aspects of the present disclosure. Those skilled in the art should appreciate that they may readily use the embodiments of the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the embodiments of the present disclosure, and that they may make various changes, substitutions, and alterations herein without departing from the spirit and scope of the embodiments of the present disclosure.

What is claimed is:

1. An enhanced-mode high electron mobility transistor (HEMT), comprising:
   a substrate;
   a first III-V semiconductor layer disposed on the substrate;
   a second III-V semiconductor layer disposed on the first III-V semiconductor layer;
   a third III-V semiconductor layer disposed on the second III-V semiconductor layer, wherein the second III-V semiconductor layer and the third III-V semiconductor layer comprise different materials to form a heterojunction;
   an amorphous region extending from the third III-V semiconductor layer into the second III-V semiconductor layer and the first III-V semiconductor layer to serve as an isolation region;
   a gate electrode disposed in the amorphous region;
   a source ohmic contact, wherein the source ohmic contact is in direct contact with the third III-V semiconductor layer; and
   a drain ohmic contact, wherein the drain ohmic contact is in direct contact with the first III-V semiconductor layer.

2. The enhanced-mode high electron mobility transistor of claim 1, wherein the amorphous region comprises an amorphized III-V semiconductor material.

3. The enhanced-mode high electron mobility transistor of claim 1, wherein the first III-V semiconductor layer comprises an n-type binary III-V semiconductor material, the second III-V semiconductor layer comprises a p-type binary III-V semiconductor material, and the third III-V semiconductor layer comprises an undoped ternary III-V semiconductor material.

4. The enhanced-mode high electron mobility transistor of claim 3, wherein the first III-V semiconductor layer comprises n-type GaN, the second III-V semiconductor layer comprises p-type GaN, and the third III-V semiconductor layer comprises undoped AlGaN.

5. The enhanced-mode high electron mobility transistor of claim 1, wherein the amorphous region is formed through an ion implantation process.

6. The enhanced-mode high electron mobility transistor of claim 1, wherein the second III-V semiconductor layer comprises a channel region, and a length of the channel region is substantially equal to a thickness of the second III-V semiconductor layer.

7. The enhanced-mode high electron mobility transistor of claim 1, further comprising:
a gate dielectric layer disposed in the amorphous region, wherein the gate dielectric layer surrounds the gate electrode.

8. The enhanced-mode high electron mobility transistor of claim 1, wherein the amorphous region does not extend to a bottom surface of the first III-V semiconductor layer.

9. A method for forming an enhanced-mode high electron mobility transistor, comprising:
providing a substrate;
forming a first III-V semiconductor layer on the substrate;
forming a second III-V semiconductor layer on the first III-V semiconductor layer;
forming a third III-V semiconductor layer on the second III-V semiconductor layer, wherein the second III-V semiconductor layer and the third III-V semiconductor layer comprise different materials to form a heterojunction;
forming an amorphous region extending from the third III-V semiconductor layer into the second III-V semiconductor layer and the first III-V semiconductor layer to serve as an isolation region;
forming a gate electrode in the amorphous region;
forming a source ohmic contact in direct contact with the third III-V semiconductor layer; and
forming a drain ohmic contact in direct contact with the first III-V semiconductor layer.

10. The method for forming an enhanced-mode high electron mobility transistor of claim 9, wherein the step of forming the amorphous region comprises:
performing an amorphization process, such that a portion of the first III-V semiconductor layer, a portion of the second III-V semiconductor layer, and a portion of the third III-V semiconductor layer are amorphized to form the amorphous region.

11. The method for forming an enhanced-mode high electron mobility transistor of claim 10, wherein the portion of the first III-V semiconductor layer does not extend to a bottom surface of the first III-V semiconductor layer.

12. The method for forming an enhanced-mode high electron mobility transistor of claim 10, wherein the amorphization process comprises an ion implantation process.

13. The method for forming an enhanced-mode high electron mobility transistor of claim 12, wherein the ion implantation process comprises implanting oxygen ions into the portion of the first III-V semiconductor layer, the portion of the second III-V semiconductor layer, and the portion of the third III-V semiconductor layer.

14. The method for forming an enhanced-mode high electron mobility transistor of claim 9, wherein the step of forming the gate electrode in the amorphous region comprises:
performing an etching process to form a gate trench in the amorphous region; and
filling the gate trench with a conductive material to form the gate electrode.

15. The method for forming an enhanced-mode high electron mobility transistor of claim 14, further comprising:
forming a gate dielectric layer in the gate trench before the step of filling the trench with the conductive material.

* * * * *